United States Patent [19]

Christie

[11] Patent Number: 5,835,511
[45] Date of Patent: Nov. 10, 1998

[54] METHOD AND MECHANISM FOR CHECKING INTEGRITY OF BYTE ENABLE SIGNALS

[75] Inventor: David S. Christie, Austin, Tex.

[73] Assignee: Advanced Micro Devices, Inc., Sunnyvale, Calif.

[21] Appl. No.: 649,244

[22] Filed: May 17, 1996

[51] Int. Cl.[6] .............................. G06F 11/10; H03M 13/00
[52] U.S. Cl. ........................ 371/49.3; 371/49.2; 371/49.1
[58] Field of Search .................................. 371/49.3, 49.1, 371/49.2

[56] References Cited

U.S. PATENT DOCUMENTS

| | | |
|---|---|---|
| 4,044,338 | 8/1977 | Wolf . |
| 4,453,212 | 6/1984 | Gaither et al. . |
| 4,580,265 | 4/1986 | Gooding et al. ........................... 371/49 |
| 4,807,115 | 2/1989 | Torng . |
| 4,858,105 | 8/1989 | Kuriyama et al. . |
| 4,928,223 | 5/1990 | Dao et al. . |
| 5,053,631 | 10/1991 | Perlman et al. . |
| 5,058,048 | 10/1991 | Gupta et al. . |
| 5,129,067 | 7/1992 | Johnson . |
| 5,136,697 | 8/1992 | Johnson . |
| 5,226,126 | 7/1993 | McFarland et al. . |
| 5,226,130 | 7/1993 | Favor et al. . |
| 5,446,873 | 8/1995 | Chan ....................................... 395/180 |
| 5,541,941 | 7/1996 | Dell et al. ............................... 371/49.3 |

FOREIGN PATENT DOCUMENTS

| | | |
|---|---|---|
| 0259095 | 3/1988 | European Pat. Off. . |
| 0381471 | 8/1990 | European Pat. Off. . |
| 0459232 | 12/1991 | European Pat. Off. . |
| 2263985 | 8/1993 | United Kingdom . |
| 2263987 | 8/1993 | United Kingdom . |
| 2281422 | 3/1995 | United Kingdom . |

OTHER PUBLICATIONS

Intel, "Chapter 2: Microprocessor Architecture Overview," pp. 2–1 through 2–4.

Michael Slater, "AMD's K5 Designed to Outrun Pentium," Microprocessor Report, vol. 8, No. 14, Oct. 24, 1994, 7 pages.

Sebastian Rupley and John Clyman, "P6: The Next Step?," PC Magazine, Sep. 12, 1995, 16 pages.

Tom R. Halfhill, "AMD K6 Takes On Intel P6," BYTE, Jan. 1996, 4 pages.

Primary Examiner—Phung M. Chung
Attorney, Agent, or Firm—Conley, Rose & Tayon, PC; B. Noel Kivlin

[57] ABSTRACT

A device and method that enables fault detection of control lines without additional fault detection lines. Prior to the transfer of a group of data, a control line is used to select whether even or odd parity is used on the group of data. After the data transfer, the same control signal is used at the destination device to select the type of parity used to check the validity of the data. If an error occurs on the control line that causes the state of the control line to change, the destination device will use the a different type of parity (even or odd parity) to check the validity of the group of data, and an error will be detected. In this manner, an error on the control line can be detected without additional parity signals.

17 Claims, 3 Drawing Sheets

METHOD AND MECHANISM FOR CHECKING INTEGRITY OF BYTE ENABLE SIGNALS

BACKGROUND OF THE INVENTION

1. Field of the Invention

This invention relates to fault detection of computer system signals and more particularly to parity fault detection of data and control signal lines.

2. Description of the Relevant Art

Many microprocessors and data communication devices provide parity bits to allow the detection of single-bit faults. Parity bits, or parity signals, indicate whether the number of activated bits in a group of data is odd or even. Two types of parity can be used: even or odd. The parity bit in an even parity system is activated if the number of activated bits in a group of data is odd. Thus, the parity bit makes the total number of activated bits in the combination of the group of data and the parity bit even. This type of parity bit is called an even parity bit. Odd parity is the inverse of even parity. The parity bit in an odd parity system is activated if the number of activated bits in the group of data is even. This type of parity bit is called an odd parity bit.

When data is transferred in a system utilizing parity, the source of the data generates the parity. The generated parity is represented by a parity bit, or parity signal, which is transferred to the destination device on a separate data line called a parity line. The destination device recalculates the parity of the transferred data and compares the recalculated parity to the parity generated by the source device. If the parity calculated at the destination is different from the parity generated by the source, then one bit, or an odd number of bits, has changed state during the data transfer. In this manner, single-bit errors can be detected. Double-bit errors, and other even numbers of bit errors, cannot be detected using the basic parity detection scheme described above.

The use of parity for fault detection requires the user to make tradeoffs between increasing the number of signal lines in a system and the probability of detecting a fault. The larger the group of data lines that one parity signal covers the more likely that a undetected double-bit error will occur. The smaller the group of data lines that one parity signal covers, the more parity signal lines that must be added, which increases the cost of the system. A common resolution to this tradeoff is to use one parity signal for each eight bits of data.

Parity can also be used to detect single-bit errors on control lines, such as byte enable, read/write, and memory/IO lines. Adding parity signals to detect faults on control lines further adds to the number of parity signals in a system. It would be desirable to add fault detection to these control lines without increasing the number of parity signals.

SUMMARY OF THE INVENTION

The problems outlined above are in large part solved by a fault detection system that uses a different type parity (even or odd parity) depending on the state of control lines. For example, in a microprocessor with a parity signal for each byte of data, odd parity is used if a byte enable line indicates that that byte is enabled, and even parity is used if that byte is not enabled. In other words, bytes that are enabled use odd parity and bytes that are not enabled use even parity. At the data transfer destination, the same byte enable signal indicates whether to check the transferred data for even or odd parity. If the state of the byte enable line has been changed during the data transfer, then the destination will check for the wrong type of parity and an error will be detected. Thus, errors of control signals, such as byte enable signals, are detected without adding any additional signal lines to the system.

Broadly speaking, the present invention contemplates a parity fault detection system comprising a parity generator configured to generate a parity bit wherein the parity bit is an even parity bit or an odd parity bit in dependence on the state of a control signal, and a parity checker configured to check the parity bit wherein the parity checker checks the parity bit for even parity or odd parity depending on the state of a control signal.

The present invention further contemplates a computer system comprising a processor core, a memory, a data bus coupled to the processor core and the memory, and a control bus coupled to the processor core and the memory. The computer system further comprises a parity generator coupled to the data bus and the control bus, wherein the parity generator is configured to generate a first parity signal and the parity generator uses even parity or odd parity in dependence on the state of a control signal, and a parity checker coupled to the data bus, the control bus, and the first parity signal, wherein the parity checker checks the first parity signal in dependence on the state of the control signal.

The present invention finally contemplates a method of detecting errors on data and control lines comprising the steps of generating a first parity signal, wherein the first parity signal is an even parity signal or an odd parity signal depending on the state of a control signal, transferring the data signals, the control signal, and the first parity signal to a destination device, and calculating a second parity signal, wherein the second parity signal is an even parity signal or an odd parity signal depending on the state of the control signal. The method further comprises comparing the first parity signal to the second parity signal.

BRIEF DESCRIPTION OF THE DRAWINGS

Other objects and advantages of the invention will become apparent upon reading the following detailed description and upon reference to the accompanying drawings in which.

Figure 1:
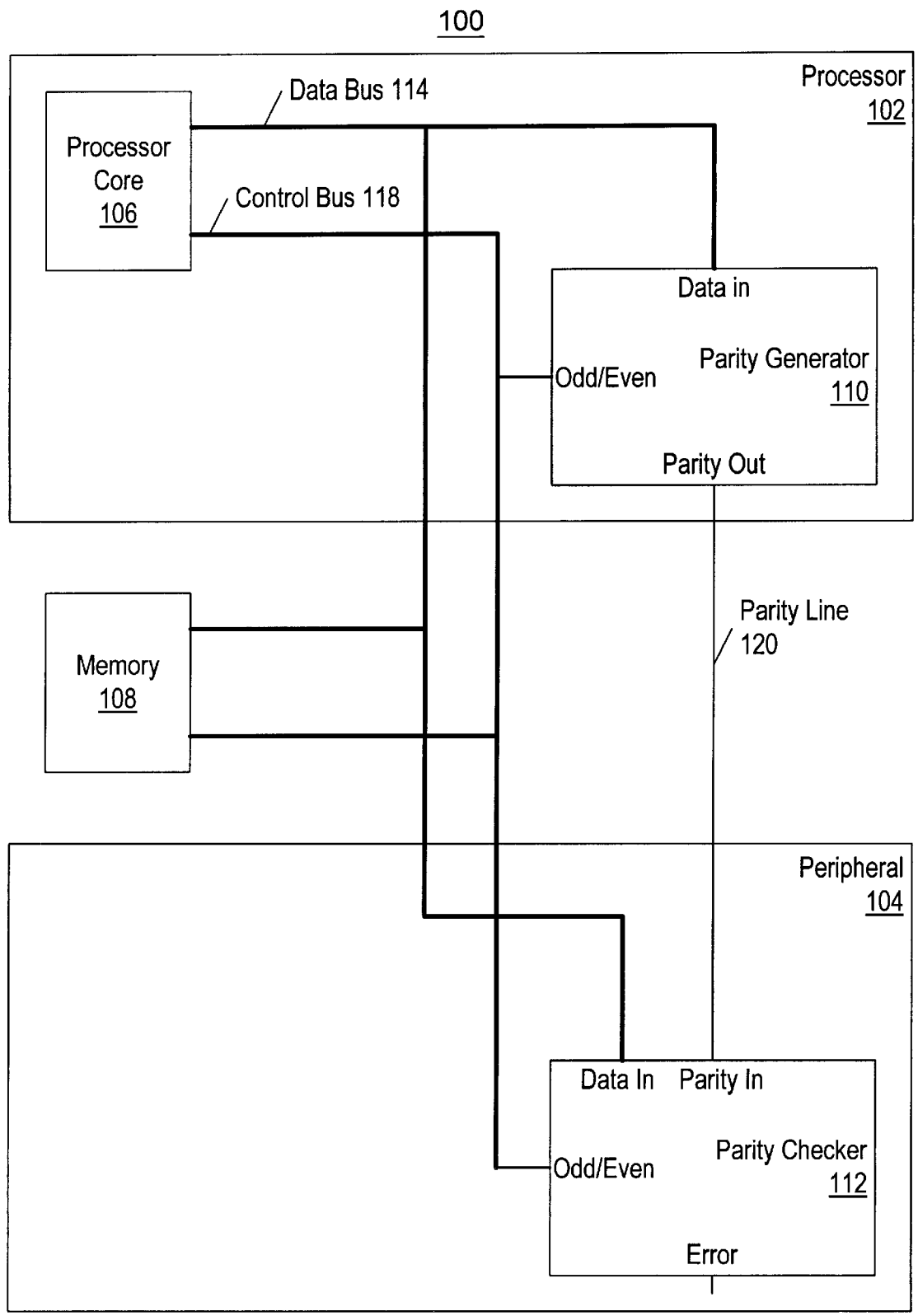
FIG. 1 is a block diagram of a computer system including parity fault detection without additional parity signal lines.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Referring now to the drawings, FIG. 1 is a block diagram of a computer system 100 including fault detection of control signals without additional parity signal lines. Computer system 100 includes a processor 102, a peripheral 104, a system memory 108, a data bus 114, a control bus 118, and a parity line 120. Processor 102 includes a processor core 106 and a parity generator 110. Peripheral 104 includes parity checker 112.

Processor core 106 implements a predetermined instruction set. Processor core 106 is illustrative of, for example, a model 80486 microprocessor core. Memory 108 is illustrative of a memory system comprised of, for example, dynamic RAM.

Processor 102 transfers data to peripheral 104 via data bus 114 and control bus 118. Data bus 114 transfers data signals, and control bus 118 transfers control signals necessary to complete the data transfer. Prior to transferring data from processor 102 to peripheral 104, parity generator 110 generates the parity of the data to be transferred. Parity generator 110 calculates either even parity or odd parity depending on the state of a control line. In one embodiment, parity generator 110 calculates odd parity of a byte of data if the byte enable line for that byte of data is activated, and even parity if the byte enable line is not activated. The parity signal, or parity bit, represents the parity generated by parity generator 110. The parity signal, or parity bit, is transferred to peripheral 104 via parity line 120.

Peripheral 104 receives the parity signal generated by parity generator 110 via parity line 120, the transferred data via data bus 114, and the control signal via control bus 118. Parity checker 112 recalculates the parity of the transferred data. The type of parity (even or odd parity) used by parity checker 112 depends on the state of the same control line used by parity generator 110. In other words, parity checker recalculates either even or odd parity depending on the state of the control signal. Parity checker 112 compares the calculated parity with the original parity generated by parity generator 110. If the parities do not match, an error has occurred during the data transfer. There are two possible sources of error. Either the state of a data line was changed or the state of the control line was changed. If the state of a data line changed, then parity checker 112 would use the same type of parity (either even or odd) as parity generator 110, but the changed state of the data line would result in a change in the parity of the data lines. Thus, an error would be detected. If the state of the control line changed, then the parity of the data lines would be the same, but parity checker 112 would use a different type of parity than parity generator 110, and parity checker 112 would detect an error. In this manner, an error on a control line can be detected using the existing data parity signal.

For example, a computer system may allocate one parity bit for each byte of data, and each byte of data may have a byte enable control signal that enables that byte of data. If a byte is enabled, parity generator 110 will generate odd parity for that byte of data. If an fault results in one data signal changing state, but the control signal is not erroneous, then parity checker 112 will calculate the same odd parity generated by parity generator 110. The erroneous data signal, however, will cause the parity calculated by parity checker 112 to be different than the original parity bit generated by parity generator 110. On the other hand, if an fault results in a erroneous control signal, parity checker 112 will generate even parity rather than odd parity. Although the state of the data lines has not changed, the parity calculated by parity checker 112 will be different than the original parity generated by parity generator 110 because parity checker 112 will use even parity rather than the odd parity used by parity generator 110.

It is apparent that a parity signal, or parity bit, may be associated with more or less data than one byte of data. As discussed above, this is largely a tradeoff between the probability of undetected double bit faults and the cost of adding parity signal to the system. It is also apparent that control lines other than byte enable lines could be used by the parity fault detection system, and multiple control lines could be used by the parity fault detection system.

Figure 2:
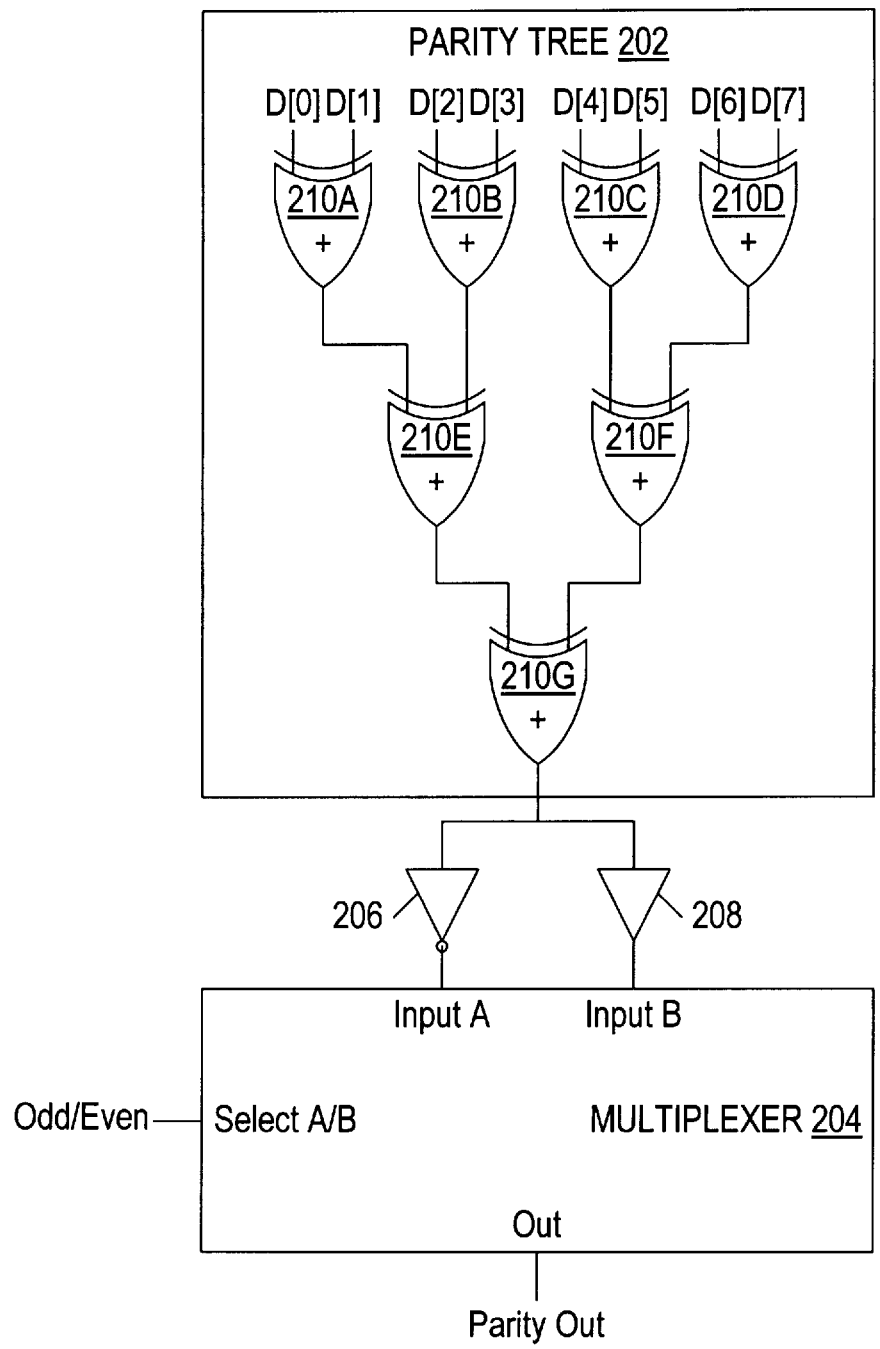
FIG. 2 is a block diagram a parity generator in accordance with the present invention.

FIG. 2 is a block diagram of one embodiment of parity generator 110. Parity generator 110 includes a parity tree 202, a multiplexer 204, an inverter 206 and a buffer 208. Parity tree 202 includes exclusive-or gates 210A–210G. Parity tree 202 is a conventional device that generates an even parity bit for data input bits D[0]–D[7]. In other words, if the number of data input bits that are activated is odd, then the output of parity tree 202 is activated. If the number of data input bits that are activated is even, then the output of parity tree 202 is not activated. The output of parity tree 202 is coupled to inverter 206 and buffer 208. The output of buffer 208 represents the even parity bit for data input bits D[0]–D[7]. The output of inverter 206 is the inverse of the output of parity tree 202. Because odd parity is the inverse of even parity, the output of inverter 206 represents the odd parity bit for data inputs bits D[0]–D[7]. The even or odd parity bit for the data input bits, i.e., the output of buffer 208 and inverter 206, respectively, are coupled to the inputs of multiplexer 204. The odd/even input to parity generator 110 is coupled to the select line of multiplexer 204 and the output of multiplexer 204 is coupled to the parity-out line of parity generator 110. Therefore, the state of the odd/even input controls whether an even parity bit or an odd parity bit is output by parity generator 110.

Figure 3:
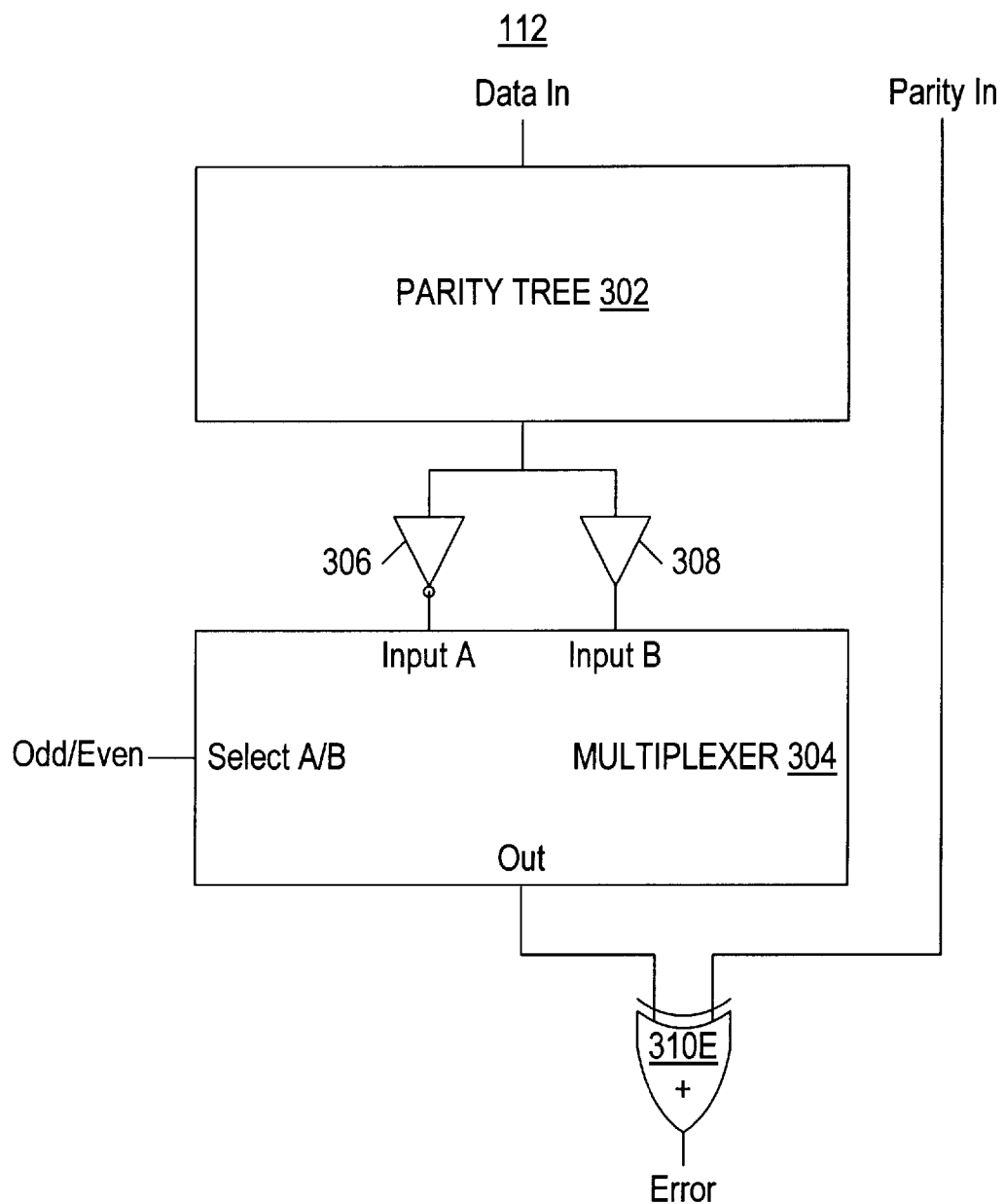
FIG. 3 is a diagram of a parity checker in accordance with the present invention.

FIG. 3 is a block diagram of parity checker 112. Parity checker 112 includes a parity tree 302, a inverter 306, a buffer 308, a multiplexer 304, and an exclusive-or gate 310. Parity tree 302 is substantially similar to parity tree 202 described in reference to FIG. 2. Parity tree 302, inverter 304, buffer 308, and multiplexer 304 operate in a substantially similar manner to parity generator 110 described above with reference to FIG. 2. Parity tree 302 calculates the parity of the data received by parity checker 112. Multiplexer 304 selects either odd or even parity in dependence on the state of the odd/even input to parity checker 112. The odd/even input is coupled to the same control signal as the odd/even input of parity generator 110. The output by multiplexer 304 is compared with the parity generated by parity generator 110 via exclusive-or gate 310. The parity bit generated by parity generator 110 is received by parity checker 112 via the parity-in signal and parity line 120. If the output by multiplexer 304 differs from the parity-in signal, a bit error has occurred during transmission. The bit error could be either a data or control bit error. If the bit error is a data bit error, then the parities will differ because the parity of the transferred data is different. If the bit error is a control bit error, then the parities will differ because the multiplexer will select a different type of parity, i.e., select odd parity instead of even parity, or even parity instead of odd parity. In the above described manner, control line errors are detected without additional parity lines.

Numerous variations and modifications will become apparent to those skilled in the art once the above disclosure is fully appreciated. It is intended that the following claims be interpreted to embrace all such variations and modifications.

What is claimed is:

1. A parity fault detection system comprising:
  a parity generator configured to generate a parity bit wherein said parity bit is an even parity bit or an odd parity bit in dependence on the state of a control signal; and a parity checker configured to check said parity bit for even parity or odd parity depending on the state of said control signal, wherein said parity checker includes:
  a first parity tree with a plurality of inputs and an output;
  a first inverter with an input coupled to said output of said first parity tree, and an output;
  a first multiplexer with one input coupled to said output of said first parity tree, one input coupled to said output of said first inverter, a select input coupled to said control signal, and an output; and
  an exclusive-or gate coupled to said first multiplexer output and said parity bit.

2. The parity fault detection system as recited in claim 1 wherein said parity generator is configured to generate said parity bit for a plurality of data bits, and wherein said control signal is an enable signal for said plurality of data bits.

3. The parity fault detection system as recited in claim 2 wherein said plurality of inputs of said first parity tree is provided with said plurality of data bits.

4. The parity fault detection system as recited in claim 3 wherein said plurality of data bits are a byte of data and said enable signal is a byte enable signal for said byte of data.

5. The parity fault detection system as recited in claim 1 wherein said parity generator includes:
  a second parity tree with a plurality of inputs and an output;
  a second inverter with an input coupled to said output of said second parity tree, and an output; and
  a second multiplexer with one input coupled to said output of said second parity tree, one input coupled to said output of said second inverter, and a select input coupled to said control signal.

6. A computer system comprising:
  a processor core;
  a memory;
  a data bus coupled to said processor core and said memory;
  a control bus coupled to said processor core and said memory;
  a parity generator coupled to said data bus and said control bus, wherein said parity generator is configured to generate a first parity signal with even parity or odd parity in dependence on the state of a control signal asserted by said processor core on said control bus; and
  a parity checker coupled to said data bus, said control bus, and coupled to receive said first parity signal, wherein said parity checker checks said first parity signal in dependence on the state of said control signal, wherein said parity checker includes:
    a first parity tree with a plurality of inputs coupled to said data bus, and an output;
    an first inverter with an input coupled to said output of said first parity tree, and an output;
    a first multiplexer with one input coupled to said output of said first parity tree, one input coupled to said output of said first inverter, a select input coupled to receive said control signal from said control bus, and an output; and
    an exclusive-or gate with one input coupled to said first multiplexer output and one input coupled said first parity signal.

7. The computer system as recited in claim 6 wherein said parity generator is configured to generate said first parity signal for a plurality of data bits asserted on said data bus, and wherein said control signal is an enable signal for said plurality of data bits.

8. The computer system as recited in claim 7 wherein said processor core is configured to assert said plurality of data bits on said data bus.

9. The computer system as recited in claim 8 wherein said plurality of data bits are a byte of data and said enable signal is a byte enable signal for said byte of data.

10. The computer system as recited in claim 9 wherein a high state of said output of said exclusive-or gate indicates whether a fault has occurred on said control signal or in said byte of data.

11. The computer system as recited in claim 9 wherein a low state of said output of said exclusive-or gate indicates a fault has occurred on said control signal or in said byte of data.

12. The computer system as recited in claim 6 wherein said parity generator includes:
  a second parity tree with a plurality of inputs coupled to said data bus, and an output;
  a second inverter with an input coupled to said output of said second parity tree, and an output; and
  a second multiplexer with one input coupled to said output of said second parity tree, one input coupled to said output of said second inverter, and a select input coupled to receive said control signal from said control bus.

13. A method of detecting an error on a plurality of data lines and a control line comprising the steps of:
  generating a first parity signal for a plurality of data bits, wherein said first parity signal is an even parity signal or an odd parity signal depending on the state of a control signal;
  transferring said plurality of data bits on said plurality of data lines, said control signal on said control line, and said first parity signal to a destination device;
  said destination device receiving said transferred data bits from said plurality of data lines, said control signal from said control line, and first parity signal;
  calculating a second parity signal, wherein said second parity signal is an even parity signal or an odd parity signal depending on the state of said received control signal, wherein said calculating a second parity signal comprises:
    computing a first parity value for said received plurality of data bits;
    inverting said first parity value; and
    selecting said first parity value or said inversion of said first parity value as said second parity signal in dependence on said received control signal; and
  comparing said second parity signal to said received first parity signal.

14. The method as recited in claim 13 wherein said control signal is an enable signal for said plurality of data bits.

15. The method as recited in claim 14 wherein said plurality of data bits are a byte of data and said enable signal is a byte enable signal for said byte of data.

16. The method as recited in claim 13 wherein said generating a first parity signal includes:
  generating a second parity value for said plurality of data bits;
  inverting said second parity value;
  selecting said second parity value or said inversion of said second parity value as said first parity signal in dependence on said control signal.

17. The method as recited in claim 13 further comprising asserting an error condition when said comparing of said first parity signal to said second parity signal determines that said first parity signal and said second parity signal are not equal.

* * * * *